United States Patent [19]

Watari

[11] Patent Number: 4,819,131
[45] Date of Patent: Apr. 4, 1989

[54] INTEGRATED CIRCUIT PACKAGE HAVING COAXIAL PINS

[75] Inventor: Toshihiko Watari, Tokyo, Japan
[73] Assignee: NEC Corporation, Tokyo, Japan
[21] Appl. No.: 89,530
[22] Filed: Aug. 26, 1987
[30] Foreign Application Priority Data Aug. 27, 1986 [JP] Japan ................................. 61-200788

[51] Int. Cl.⁴ ............................................. H05K 1/14
[52] U.S. Cl. .................................... 361/414; 361/406;
  361/413; 361/425; 439/65; 439/75
[58] Field of Search ............... 361/397, 404, 406, 410,
  361/412, 413, 414, 425; 439/65, 74, 75, 581

[56] References Cited

U.S. PATENT DOCUMENTS 4,231,629  11/1980  Kirby ..................................... 439/65
4,612,601   9/1986  Watari .................................. 361/387

FOREIGN PATENT DOCUMENTS 0224456  6/1987  European Pat. Off. ............. 361/404

OTHER PUBLICATIONS

Heath et al., "Coaxial Connector", IBM Technical Disclosure Bulletin, vol. 21, No. 10, Mar. 1979, pp. 3987–3988.

Primary Examiner—A. D. Pellinen
Assistant Examiner—Gregory D. Thompson
Attorney, Agent, or Firm—Burns, Doane, Swecker & Mathis

[57] ABSTRACT

An integrated circuit package including a multilayer ceramic substrate for mounting a plurality of integrated circuit chips on a first surface thereof. The substrate is provided with a power supply layer, a ground connection layer and circuit patterns. An array of coaxial pins is juxtaposed on the opposite surface of the substrate. Each coaxial pin includes an inner conductor and an outer conductor. The inner conductor of one or more coaxial pins is connected to the power supply layer and the inner conductors of the remaining coaxial pins are connected to the circuit patterns. The outer conductors of all the coaxial pins are connected to the ground connection layer.

5 Claims, 4 Drawing Sheets

INTEGRATED CIRCUIT PACKAGE HAVING COAXIAL PINS

BACKGROUND OF THE INVENTION

The present invention relates to integrated circuit packages, and more specifically to an integrated circuit package suitable for high speed processors.

Propagation delays caused by interconnecting wires between logic gates are a major contributing factor in the overall speed of integrated circuitry. Wire delays on LSI chips become increasingly important as circuit density and speed increase. In high speed processors, the wire delay can account for half the overall delay of the system. As circuit density increases there is a corresponding increase in the number of input/output pins according to the known empirical formula $P=kG^r$, where P represents the pin count, G represents the number of gates, and k and r are constants. If it is desired to mount 5000 gates on a single package, for example, more than 2300 input/output pins would be required. Furthermore, for uniform power distribution the same number of power supply pins would be required.

In a known LSI package as disclosed in U.S. Pat. No. 4,612,601 issued to T. Watari, input/output pins are juxtaposed in alternate relationship with power supply and ground connection pins, requiring a substantial amount of surface area. In addition, for high speed processing, the problems of waveform distortion and crosstalk arise due to mismatched impedances at the input/output pins.

SUMMARY OF THE INVENTION

It is therefore an object of the present invention to provide an integrated circuit package having a high density pin array which is free from waveform distortion and crosstalk.

Specifically, the integrated circuit package of the present invention comprises a multilayer substrate for mounting a plurality of integrated circuit chips on a first surface thereof, the multilayer substrate having a power supply layer, a ground connection layer and circuit patterns and means for connecting terminals of the chips to the layers. An array of coaxial pins is juxtaposed on a second surface of the multilayer substrate opposite to the first surface. Each of the coaxial pins comprises an inner conductor and an outer conductor surrounding the inner conductor. The inner conductor of one or more of the coaxial pins is connected to the power supply layer and the inner conductors of the remaining coaxial pins are connected to the circuit patterns, the outer conductors of all of the coaxial pins being connected to the ground connection layer. Since the inner conductor through which signals are conducted is electrically shielded by the grounded outer conductor, the waveform distortion and crosstalk problems can be successfully eliminated. Since the outer conductor is used for ground connection, space saving can be achieved.

BRIEF DESCRIPTION OF THE DRAWINGS

The present invention will be described in further detail with reference to the accompanying drawings, in which.

DETAILED DESCRIPTION

Figure 1:
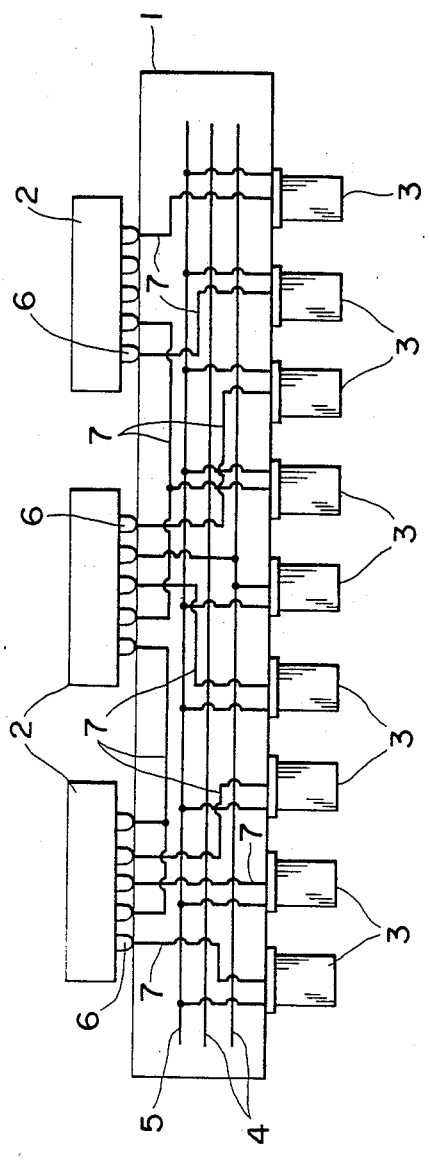
FIG. 1 is a side view of an integrated circuit package according to the present invention.

Referring to FIG. 1, an integrated circuit package according to the invention comprises a multilayer ceramic substrate 1 and a plurality of integrated circuit chips 2 mounted on the upper surface of the multilayer substrate 1. An array of coaxial pins 3 of identical construction are firmly secured to the lower surface of the substrate 1. Multilayer substrate 1 is fabricated by a known multilayer ceramic technology in which a ceramic slurry of a ceramic powder (mixture of alumina and glass) and polymer binder is first prepared, then cast into thin sheets by passing through sheet forming machines. After drying, the sheets are cut to size, via holes are mechanically punched into the sheet, and custom wiring paths are formed by screening a slurry of tungsten or molybdenum onto the surface of the sheet and the via holes are filled with metal. Several of these sheets are precisely aligned and press-laminated together and the entire structure is fired at an elevated temperature to form a monolithic sintered body.

Multilayer substrate 1 comprises one or more power layers 4 and a ground layer 5. Integrated circuit chips 2 are appropriately connected to power layers 4 and ground layer 5 by connecting leads, not shown. Printed circuit patterns 7 are formed between such layers to connect chip terminals 6 to pins 3.

Figure 2:
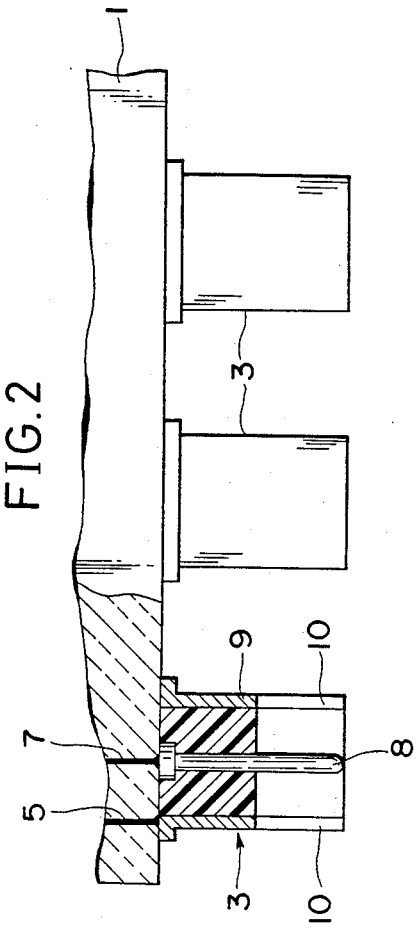
FIG. 2 is an enlarged view partly, in section of the pins of FIG. 1.

As shown in FIG. 2, each of the coaxial pins 3 is constructed of an inner conductor 8 and an outer conductor 9 having either a circular or rectangular cross-section. Coaxial pins 3 function as input/output pins or power pins. The inner conductor 8 of each input/output pin is connected to an appropriate circuit pattern 7 and the inner conductor 8 of each power pin is connected to one of the power layers 4. The outer conductors 9 of both input/output pins and power pins are connected to the ground layer 5. Brazing technique is used to accomplish such electrical connections.

Since the inner conductor 8 of each input/output pin 3 is electrically shielded by the outer conductor 9 which is grounded, the present invention completely eliminates waveform distortion and crosstalk which would otherwise occur as a result of high speed processing of signals. A further advantage of this invention is that since ground connection is integrated with either input/output connection and power connection, the coaxial pins 3 can be arranged with a higher packing density than that achieved with the prior art pin construction.

Figure 3:
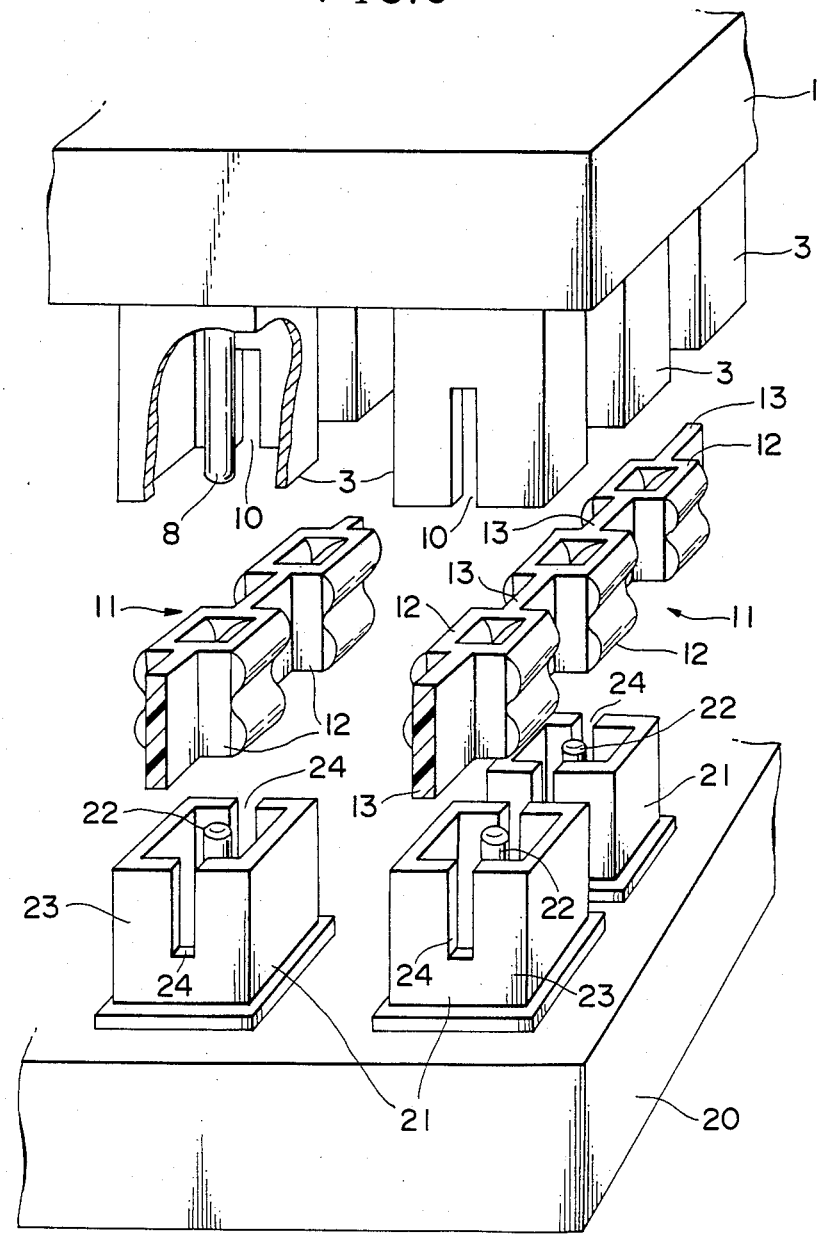
FIG. 3 is a perspective view of the integrated circuit package with associated pin connectors and a mother board.
Figure 4:
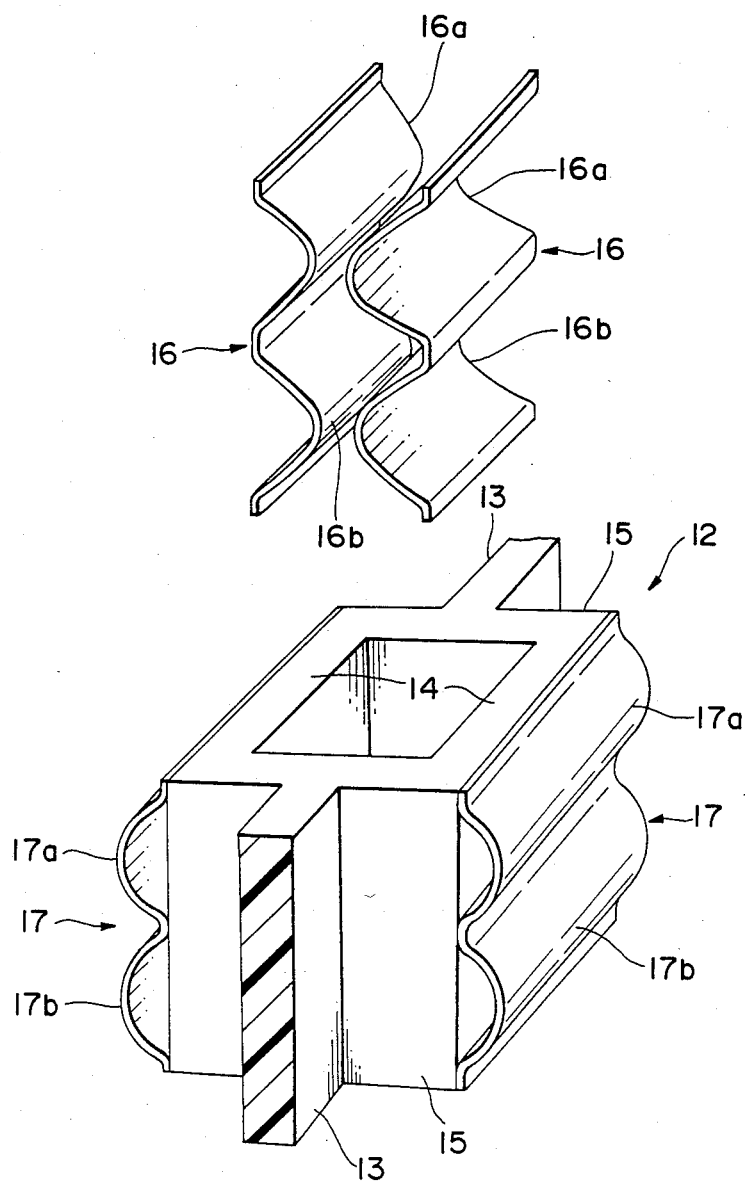
FIG. 4 is an exploded, perspective view of a section of the pin connectors of FIG. 3.

FIGS. 3 to 6 are illustrations of an embodiment which facilitates connection of the coaxial pins 3 to a mother board. As shown in FIG. 3, coaxial pins 3 are arranged in a matrix of rows and columns and each pin is of a rectangular construction and formed with a pair of slits 10 on opposite walls, the slits 10 being aligned with those of adjacent pins 3. For each row of the pin array is provided a pin connector 11 which comprises a series of connector sections 12 which are interconnected by insulative coupling sections or arms 13. As illustrated in detail in FIG. 4, each connector section 12 is formed of opposed side portions 14 and opposed end portions 15 both of insulative material. Inner electrical spring contacts 16 are secured respectively to the inner walls of side portions 14 and outer electrical spring contacts 17 are secured respectively to the outer walls of side portions 14. Each of the inner contacts 16 has an upper contact portion 16a and a lower contact portion 16b. Likewise, each of the outer contacts 17 has an upper contact portion 17a and a lower contact portion 17b.

Figure 5:
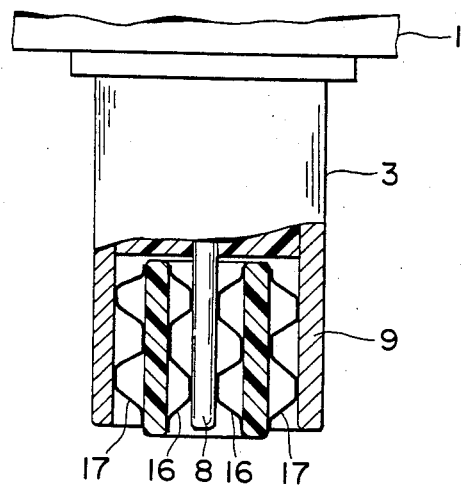
FIG. 5 is a cross-sectional view of a pin accommodating a pin connector.

Prior to connection to a mother board, connector sections 12 are respectively engaged with coaxial pins 3 of each row as shown in FIG. 5, with the coupling sections 13 being slidably fitted into the slits 10 of the corresponding pin 3, and the inner and outer spring contacts 16 and 17 being in pressure contact with the inner and outer conductors 8 and 9 of the corresponding coaxial pin 3, respectively.

A mother board 20 is provided with an array of coaxial pins 21 identical in construction to the coaxial pins 3 and arranged in positions corresponding to associated coaxial pins 3. Each coaxial pin 21 of the mother board has an inner conductor 22 and an outer conductor 23 of the same size as the inner and outer conductors of the corresponding coaxial pin 3. The outer conductor 23 of each coaxial pin 21 is formed with slits 24 in positions which align with the slits 10 of the corresponding coaxial pin 3.

Figure 6:
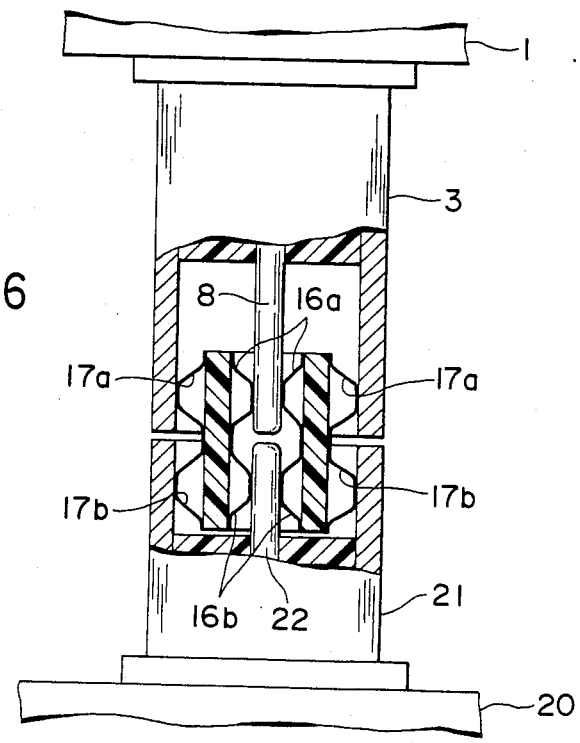
FIG. 6 is a cross-sectional view of associated pins on the integrated circuit package and mother board being electrically interconnected by the pin connector.

When connection is to be made between the coaxial pins 3 and 21, the pin connector 11 is forced downward so that coupling arms 13 partially slide out of the slits 10 of upper pins 3 into the slits 24 of the lower pins 21. This sliding movement can be made by applying force to the coupling arms 13. As illustrated in FIG. 6, the lower contact portions 16b of inner contacts 16 are brought into pressure contact with the inner conductor 22 of coaxial pin 21 with the upper contact portions 16a remaining in pressure contact with the inner conductor 8 of coaxial pin 3, and the lower contact portions 17b of outer contacts 17 are brought into pressure contact with the outer conductor 23 of coaxial pin 21 with the upper contact portions 17a remaining in pressure contact with the outer conductor 9 of coaxial pin 3, whereby electrical connections are established between the inner conductors 8 and 22 and between the outer conductors 9 and 23 of the corresponding pins.

The foregoing description shows only preferred embodiments of the present invention. Various modifications are apparent to those skilled in the art without departing from the scope of the present invention which is only limited by the appended claims. Therefore, the embodiments shown and described are only illustrative, not restrictive.

What is claimed is:

1. An integrated circuit package comprising:
   a multilayer substrate for mounting a plurality of integrated circuit chips on a first surface thereof, said multilayer substrate having a power supply layer, a ground connection layer and circuit patterns, and said chips being electrically connected to said layers; and
   an array of coaxial pins juxtaposed on a second surface of said multilayer substrate opposite to said first surface, each of said coaxial pins comprising an inner conductor and an outer conductor surrounding the inner conductor, the inner conductor of one or more of said coaxial pins being connected to said power supply layer, the inner conductors of the remaining coaxial pins being connected to said circuit patterns, and the outer conductors of all of said coxial pins being connected to said ground connection layer.

2. An integrated circuit package as claimed in claim 1, further comprising a pin connector for electrically connecting said coaxial pins to a mother board.

3. An integrated circuit package as claimed in claim 2, wherein said pin connector comprises a series of interconnected insulative connector sections spaced at intervals corresponding to those of said coaxial pins which are arranged in a row, each of said connector sections having an inner electrical contact secured to an inner wall of said connector sections and arranged to establish an electrical connection exclusively with the inner conductor of the corresponding coaxial pin and an outer electrical contact secured to an outer wall of said connector sections and arranged to establish an electrical connection exclusively with the outer conductor of the corresponding coaxial pin.

4. An integrated circuit package as claimed in claim 3, wherein said mother board includes an array of second coaxial pins identical in construction to, and juxtaposed in respectively corresponding positions to, said coaxial pins of the substrate, and wherein said inner electrical contact of each of said connector sections has first and second contact sections respectively engageable with the inner conductor of a corresponding one of said coaxial pins of said substrate and the inner conductor of a corresponding one of said second coaxial pins, and wherein said outer electrical contact of each of said connector sections has first and second contact sections respectively engageable with the outer conductor of a corresponding one of said coaxial pins of said substrate and the outer conductor of a corresponding one of said second coaxial pins.

5. An integrated circuit package as claimed in claim 4, wherein said insulative connector sections are interconnected by coupling sections and wherein each of said coaxial pins of said multilayer substrate and said second coaxial pins is formed with slits for slidably receiving said coupling sections.

* * * * *